(12) United States Patent
Takata

(10) Patent No.: US 7,486,158 B2
(45) Date of Patent: Feb. 3, 2009

(54) BRANCHING FILTER

(75) Inventor: Toshiaki Takata, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 3 days.

(21) Appl. No.: 11/766,233

(22) Filed: Jun. 21, 2007

(65) Prior Publication Data

US 2007/0247259 A1 Oct. 25, 2007

Related U.S. Application Data

(63) Continuation of application No. PCT/JP2005/021862, filed on Nov. 29, 2005.

(30) Foreign Application Priority Data

Dec. 24, 2004 (JP) .............................. 2004-373986

(51) Int. Cl.
*H03H 9/72* (2006.01)

(52) U.S. Cl. ...................... 333/133; 333/193

(58) Field of Classification Search ................. 333/133, 333/193, 195
See application file for complete search history.

(56) References Cited

U.S. PATENT DOCUMENTS

| | | | |
|---|---|---|---|
| 6,150,904 A | 11/2000 | Taniguchi et al. | |
| 6,208,224 B1 | 3/2001 | Taniguchi et al. | |
| 6,570,470 B2 | 5/2003 | Maehara et al. | |
| 6,819,203 B2 | 11/2004 | Taniguchi | |
| 6,903,626 B2 | 6/2005 | Tsutsumi et al. | |
| 7,116,187 B2 | 10/2006 | Inoue | |
| 7,170,370 B2 * | 1/2007 | Inoue et al. .................. | 333/189 |
| 2003/0058066 A1 | 3/2003 | Taniguchi et al. | |
| 2003/0062969 A1 | 4/2003 | Inoue | |
| 2003/0214368 A1 | 11/2003 | Taniguchi | |
| 2004/0090288 A1* | 5/2004 | Inoue ......................... | 333/133 |
| 2005/0046520 A1 | 3/2005 | Nishizawa et al. | |

FOREIGN PATENT DOCUMENTS

| | | | |
|---|---|---|---|
| JP | 4-81823 | * | 3/1992 |
| JP | 05-327399 A | | 12/1993 |

(Continued)

OTHER PUBLICATIONS

Official Communication for PCT Application No. PCT/JP2005/021862; mailed Mar. 14, 2006.

*Primary Examiner*—Barbara Summons
(74) *Attorney, Agent, or Firm*—Keating & Bennett, LLP

(57) ABSTRACT

A branching filter suppresses the effect of a ripple at a high frequency side of a first band-pass filter having a relatively low frequency passband and achieves sufficient pass band widths of the first and second band-pass filters. The branching filter includes a first band-pass filter having a relatively low frequency passband and a second band-pass filter having a relatively high frequency passband. The first and second band-pass filters each have a SAW filter having a ladder circuit structure. The second band-pass filter has first to third parallel resonators. The first and second parallel resonators are commonly connected to a common-connection ground terminal. A first inductance is connected between the common-connection ground terminal and a ground potential. In the branching filter, a relationship $f1 > f0 > f2$ is satisfied, wherein $f0$ denotes an average of resonant frequencies of all the parallel resonators.

6 Claims, 8 Drawing Sheets

FOREIGN PATENT DOCUMENTS

| | | |
|---|---|---|
| JP | 10-093382 A | 4/1998 |
| JP | 10-200370 A | 7/1998 |
| JP | 11-312951 A | 11/1999 |
| JP | 11-340783 A | 12/1999 |
| JP | 2000-077972 A | 3/2000 |
| JP | 2000-341086 * | 12/2000 |
| JP | 2002-141771 A | 5/2002 |
| JP | 2002-232265 A | 8/2002 |
| JP | 2002-314372 A | 10/2002 |
| JP | 2003-069381 A | 3/2003 |
| JP | 2003-110404 A | 4/2003 |
| JP | 2003-152501 A | 5/2003 |
| JP | 2003-188681 A | 7/2003 |
| JP | 2003-249841 A | 9/2003 |
| JP | 2003-332885 A | 11/2003 |
| JP | 2004-007094 A | 1/2004 |

* cited by examiner

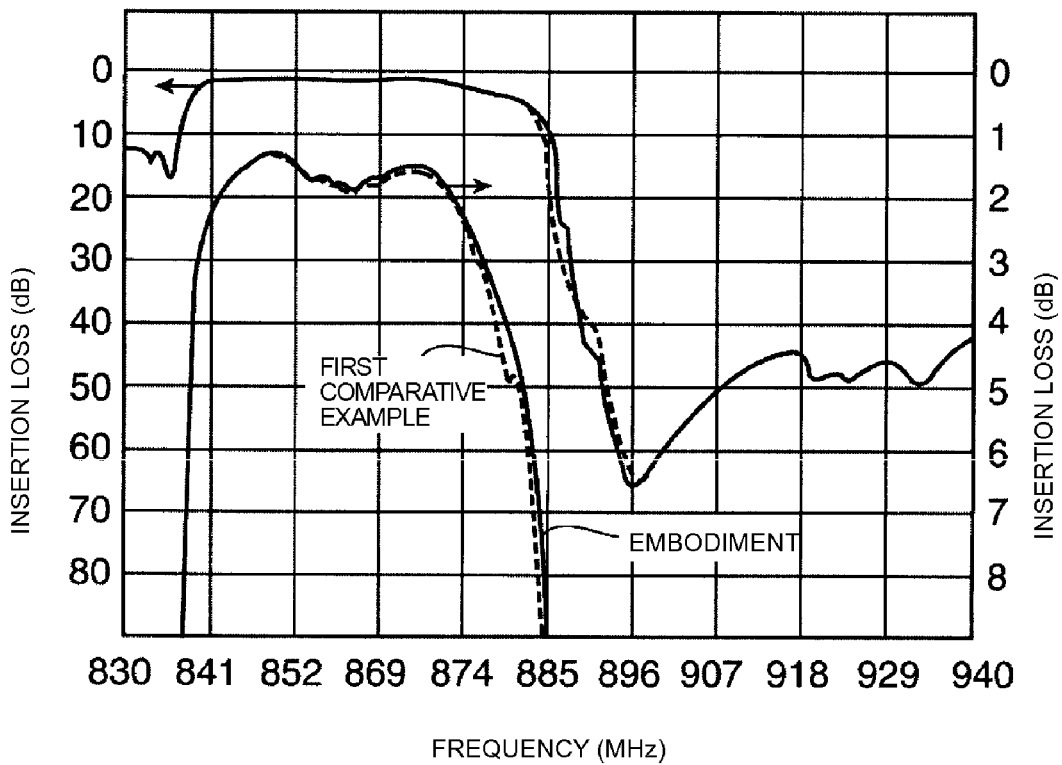
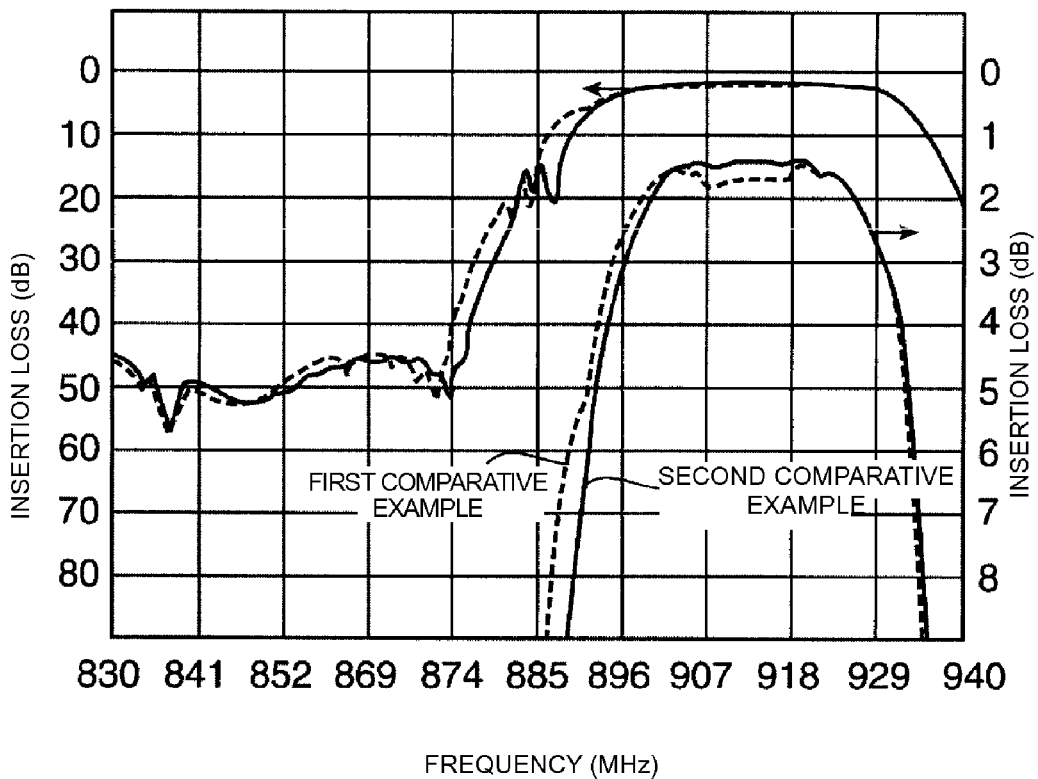

— 0 nH
------- 1.0 nH
—·—· 2.0 nH

BRANCHING FILTER

FIELD OF THE INVENTION

The present invention relates to branching filters used in mobile communication devices, such as cellular phones, and more particularly, to a branching filter including a surface acoustic wave (SAW) filter having a ladder circuit structure.

DESCRIPTION OF THE RELATED ART

Band-pass filters including SAW filters are widely used in, for example, mobile communication devices, such as cellular phones, for the purpose of miniaturization. An exemplary SAW filter of this type is disclosed in Japanese Unexamined Patent Application Publication No. 10-200370 described below. FIG. 13 is a circuit diagram of a SAW filter described in Japanese Unexamined Patent Application Publication No. 10-200370.

A SAW filter 101 has a ladder circuit structure including series resonators Sa and Sb and parallel resonators Pa to Pc.

In the above-described SAW filter 101, the parallel resonator Pa is connected to a ground potential with an inductance I1 interposed therebetween. In contrast, ground-potential-side terminals of the parallel resonators Pb and Pc located on different parallel arms are commonly connected to a node 102. An inductance I2 is connected between the node 102 and the ground potential.

The ladder filter having a structure in which the ground-potential-side terminals of the parallel resonators Pb and Pc located on the different parallel arms are commonly connected to the ground potential with the inductance I2 interposed therebetween is referred to as a polar filter since the ladder filter has an attenuation pole at the low frequency side near the passband. Since the ladder filter has the attenuation pole at the low frequency side of the passband, it is regarded that the attenuation near the low frequency side of the passband can be increased.

A polar filter having a ladder circuit structure, such as the SAW filter 101, has an attenuation pole at the low frequency side of the passband. Of a transmission-side band-pass filter and a receiving-side band-pass filter incorporated in a branching filter, the SAW filter 101 is preferably used as a band-pass filter having a relatively high frequency passband.

However, when a polar filter, such as the SAW filter 101, is used as a band-pass filter having a relatively high frequency passband in a branching filter, it has been known that an undesired ripple occurs at the high frequency side of the passband of the other band-pass filter having a low frequency passband. That is, with the addition of the inductance I2, the attenuation near the low frequency side of the passband of the SAW filter can be increased. However, the larger the inductance, the more likely a large ripple occurs in skirt characteristics at the low frequency side of the passband. In filter characteristics of the other band-pass filter having the low passband, a ripple occurs at substantially the same frequency position as the above-described ripple, which may result in a narrower pass band width of the other band-pass filter.

SUMMARY OF THE INVENTION

In order to overcome the problems described above, preferred embodiments of the present invention provide a branching filter including a first band-pass filter having a relatively low frequency passband and a second band-pass filter having a relatively high frequency passband, each having a SAW filter having a ladder circuit structure, the branching filter not only increasing the attenuation at the low frequency side of the passband of the second band-pass filter, but also suppressing the occurrence of a ripple at the high frequency side of the passband of the first band-pass filter, thereby achieving a sufficient pass band width.

According to a preferred embodiment of the present invention, a branching filter includes a first band-pass filter having a relatively low frequency passband and a second band-pass filter having a relatively high frequency passband. The first and second band-pass filters each include a surface acoustic wave filter having a ladder circuit structure including series resonators and parallel resonators, and ends of the first and second band-pass filters are connected to one common terminal. The second band-pass filter is a polar filter including a first parallel resonator having a relatively high impedance $Z_1$ and a relatively high resonant frequency f1, a second parallel resonator having a relatively low impedance $Z_2$ and a relatively low resonant frequency f2, the second parallel resonator being connected to a parallel arm that is different from that to which the first parallel resonator is connected, a common-connection GND terminal commonly connected to ends of the first parallel resonator and the second parallel resonator, the ends being connected to a ground potential, a first inductance connected between the common-connection GND terminal and the ground potential, a third parallel resonator connected to a parallel arm that is different from those to which the first and second parallel resonators are connected, and a second inductance connected between the third parallel resonator and the ground potential. In the branching filter, a relationship f1>f0>f2 is satisfied, where f0 denotes an average of resonant frequencies of all the parallel resonators.

According to a preferred embodiment of the present invention, the branching filter further includes at least one fourth parallel resonator connected to a parallel arm that is different from those to which the first and second parallel resonators are connected. The fourth parallel resonator has an end connected to the ground potential and to the common-connection GND terminal.

According to another preferred embodiment of the present invention, parallel arms connected to the common-connection GND terminal include only the parallel arm on which the first parallel resonator is located and the parallel arm on which the second parallel resonator is located.

According to yet another specific preferred embodiment of the branching filter of the present invention, the resonant frequency of the third parallel resonator is different from the resonant frequencies of the first and second parallel resonators.

According to a further preferred embodiment of the present invention, the first parallel resonator and the second parallel resonator each have an electrode structure including an IDT. A duty of electrode fingers of the IDT of the first parallel resonator is different from a duty of electrode fingers of the IDT of the second parallel resonator so that the resonant frequency of the first parallel resonator is different from the resonant frequency of the second parallel resonator.

According to another preferred embodiment of the present invention, an attenuation pole at a high frequency side of a passband of the first band-pass filter is set to a frequency that is higher than that of an attenuation pole at a low frequency side of a passband of the second band-pass filter.

According to another preferred embodiment of the present invention, the first and second band-pass filters each include a SAW filter having a ladder circuit structure including series arms and parallel arms. The second band-pass filter having a relatively high frequency passband serves as the above-described polar filter. That is, in the second band-pass filter, the first parallel resonator and the second parallel resonator, which is connected to the parallel arm that is different from that to which the first parallel resonator is connected, are commonly connected to the ground potential with the first inductance interposed therebetween. Therefore, an attenuation pole is formed at the low frequency side of the passband of the second band-pass filter, thereby increasing the attenuation at the low frequency side of the passband.

Furthermore, according to a preferred embodiment of the present invention, let f0 be the average of the resonant frequencies of all the parallel resonators, and f1 and f2 be the resonant frequencies of the first and second parallel resonators, respectively, then, a relationship f1>f0>f2 is satisfied. Therefore, large ripple at the high frequency side of the passband of the first band-pass filter is reliably suppressed. The pass band width of the first band-pass filter is less likely to become narrower.

According to a preferred embodiment of the present invention, a branching filter can not only increase the attenuation at the low frequency side of the passband of the second band-pass filter, but also can achieve a sufficiently wide pass band of the first band-pass filter.

According to a preferred embodiment of the present invention, in addition to the first and second parallel resonators, at least one fourth parallel resonator connected to the common-connection GND terminal may be provided. In this case, frequencies of attenuation poles corresponding to the resonant frequency of the circuit including the first and second parallel resonators, the fourth parallel resonator, and the first inductance are dispersed, thereby dispersing the occurrence positions of ripples. As a result, the effect of the ripples can be reduced.

More preferably, parallel arms connected to the common-connection GND terminal include only the parallel arm on which the first parallel resonator is located and the parallel arm on which the second parallel resonator is located. In this case, attenuation poles corresponding to the resonant frequency of the circuit including the first and second parallel resonators and the first inductance are effectively dispersed, thereby effectively reducing the effect of the ripples. In addition, the branching filter of preferred embodiments of the present invention has a simple circuit structure.

In the case that the resonant frequency of the third parallel resonator is different from the resonant frequencies of the first and second parallel resonators, the occurrence positions of ripples can be dispersed more effectively.

According to a preferred embodiment of the present invention, the manner in which the first parallel resonator and the second parallel resonator have different resonant frequencies is not particularly limited. In the case that the first and second parallel resonators each have an electrode structure having an IDT, a duty of electrode fingers of the IDT of the first parallel resonator is made different from a duty of electrode fingers of the IDT of the second parallel resonator so that the resonant frequency of the parallel resonator becomes different from the resonant frequency of the second parallel resonator. In this case, the first and second parallel resonators can have different resonant frequencies by simply making the duties of the IDTs different.

In the case that an attenuation pole at the high frequency side of the passband of the first band-pass filter is set to a frequency that is higher than that of an attenuation pole at the low frequency side of the passband of the second band-pass filter, the effect of the ripple that often occurs at the high frequency side of the passband of the first band-pass filter can be effectively suppressed according to a preferred embodiment of the present invention.

Other features, elements, steps, characteristics and advantages of the present invention will be described below with reference to preferred embodiments thereof and the attached drawings.

BRIEF DESCRIPTION OF THE DRAWINGS

FIG. 6 is a graph showing filter characteristics of the first band-pass filter serving as the reception-side band-pass filter of the branching filter according to the second preferred embodiment of the present invention and a second comparative example.

FIG. 7 is a graph showing filter characteristics of the second band-pass filter serving as the transmission-side band-pass filter of the branching filter according to the second comparative example and the first comparative example of preferred embodiments of the present invention.

DETAILED DESCRIPTION OF PREFERRED EMBODIMENTS

The present invention will become apparent from the following description of specific preferred embodiments of the present invention with reference to the drawings.

First Preferred Embodiment

Figure 1A:
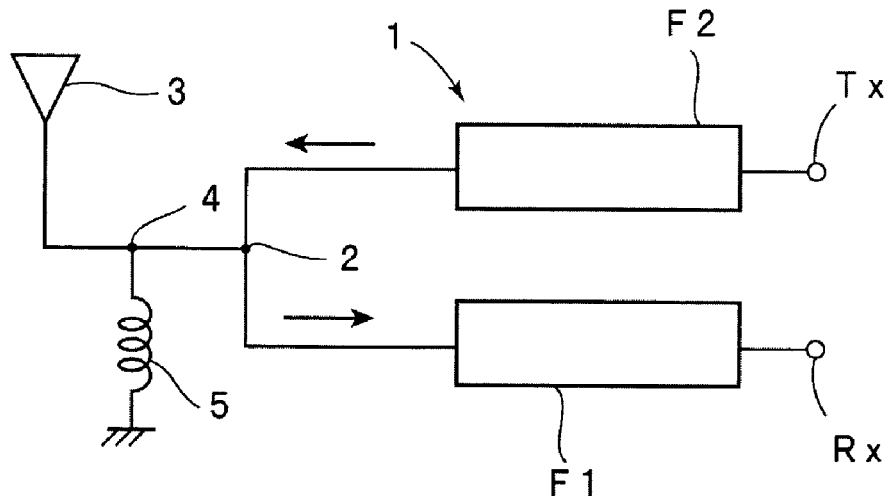
FIGS. 1A-1C include a block diagram showing the circuit structure of a branching filter according to a first preferred embodiment of the present invention, a circuit diagram of a first band-pass filter of the branching filter, and a circuit diagram of a second band-pass filter F2 of the branching filter.
Figure 1B:
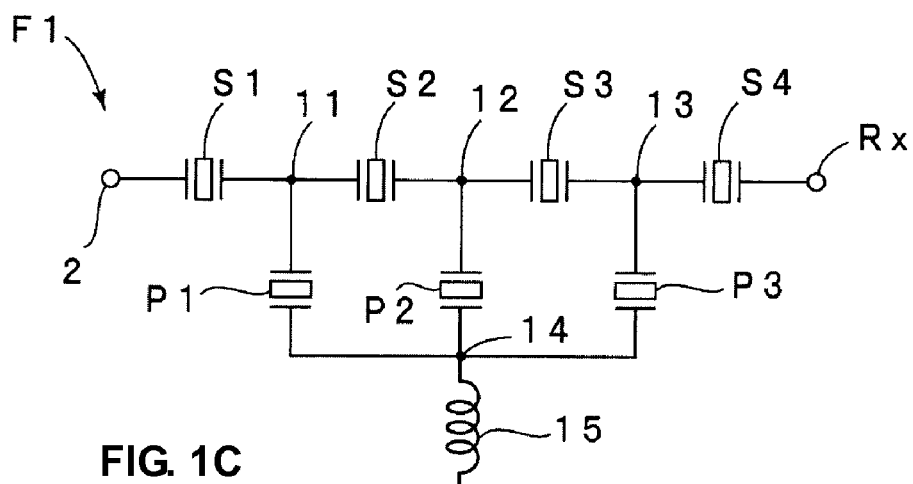
Figure 1C:
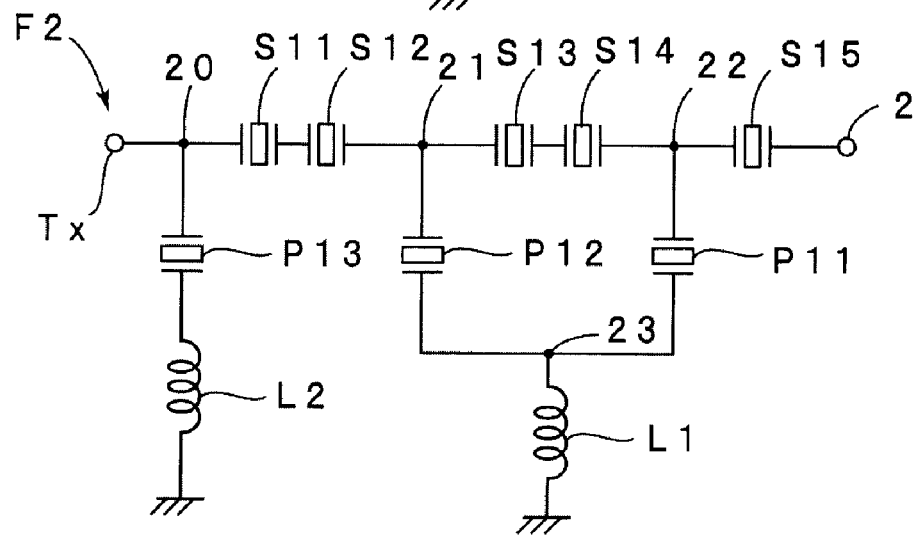

FIG. 1A is a block diagram showing a schematic structure of a branching filter according to a first preferred embodiment of the present invention, and FIG. 1B and FIG. 1C are circuit diagrams of a first band-pass filter F1 serving as a reception-side band-pass filter according to the first preferred embodiment and a second band-pass filter F2 serving as a transmission-side band-pass filter according to the first preferred embodiment, respectively.

A branching filter 1 of the first preferred embodiment is preferably a branching filter for a CDMA-800 cellular phone used in Japan. The branching filter according to this standard has a transmission-side passband of 898-925 MHz and a reception-side passband of 843-870 MHz. Thus, the transmission-side passband is higher than the reception-side passband.

As shown in FIG. 1A, the branching filter 1 preferably includes the first and second band-pass filters F1 and F2. The first band-pass filter F1 is the reception-side band-pass filter having a relatively low frequency passband. The second band-pass filter F2 is the transmission-side band-pass filter having a relatively high frequency passband.

Ends of the first and second band-pass filters F1 and F2 are commonly connected to a node 2. The node 2 is connected to an antenna 3. An inductance 5 is connected between a node 4, which is between the node 2 and the antenna 3, and a ground potential. The inductance 5 is provided to match impedance of the branching filter 1 with an input and an output of the antenna 3.

An end of the first band-pass filter F1 opposite to the node 2 is connected to a reception terminal Rx. An end of the second band-pass filter F2 opposite to the node 2 is connected to a transmission terminal Tx.

As shown in FIG. 1B, the first band-pass filter F1 serving as the reception-side band-pass filter has series arms connected between the node 2 and the reception terminal Rx. The first band-pass filter F1 has four series resonators S1 to S4 connected to the series arms. The series resonators S1 to S4 are SAW resonators. The series resonators S1 to S4 are connected in series to one another, as shown in the drawing.

In contrast, a parallel resonator P1 is connected to a first parallel arm interposed between a node 11, which is between the series resonators S1 and S2, and the ground potential. A second parallel resonator P2 is connected to a parallel arm extending between a node 12, which is between the series resonators S2 and S3, and the ground potential. A third parallel resonator P3 is connected so as to construct a third parallel arm interposed between a node 13, which is between the series resonators S3 and S4, and the ground potential. Ends of the parallel resonators P1 to P3, which are connected to the ground potential, are commonly connected to a node 14. An inductance I5 is connected between the node 14 and the ground potential.

Thus, the first band-pass filter F1 serving as the reception-side band-pass filter preferably is a SAW filter having a ladder circuit structure.

In contrast, as shown in FIG. 1C, the second band-pass filter F2 at the transmission side passband has series arms extending between the node 2 and the transmission terminal Tx. The second band-pass filter F2 has series resonators S11 to S15 connected to the series arms. The series resonators S11 to S15 are connected in series to one another and are SAW resonators.

Three parallel arms are structured to have first ends thereof being connected to the series arms. To simplify the description, a parallel resonator connected to a first parallel arm extending between a node 22, which is between the series resonators S14 and S15, and the ground potential is regarded as a first parallel resonator P11. A parallel resonator connected to a second parallel arm extending between a node 21, which is between the series resonators S12 and S13, and the ground potential is regarded as a second parallel resonator p12. A parallel resonator provided on a third parallel arm extending between a node 20, which is between the transmission terminal Tx and the series resonator S11, and the ground potential is regarded as a third parallel resonator P13.

That is, the first to third parallel resonators P11 to P13 are provided on the different parallel arms.

Ground-potential-side ends of the first and second parallel resonators P11 and P12 are commonly connected to a common-connection GND terminal 23. A first inductance L1 is connected between the common-connection GND terminal 23 and the ground potential.

A second inductance L2 is connected between a ground-side end of the third parallel resonator P13 and the ground potential.

The second band-pass filter F2 preferably is a polar filter. By adjusting the inductance values of the inductances L1 and L2, the occurrence position of an attenuation pole at the low frequency side of the passband and the attenuation at the attenuation pole can be adjusted.

By adjusting the inductance L1, the attenuation near the low frequency side of the passband of the band-pass filter F2 can be increased. However, the above-described problem still occurs. This will be described with reference to FIGS. 11 and 12.

Figure 11:
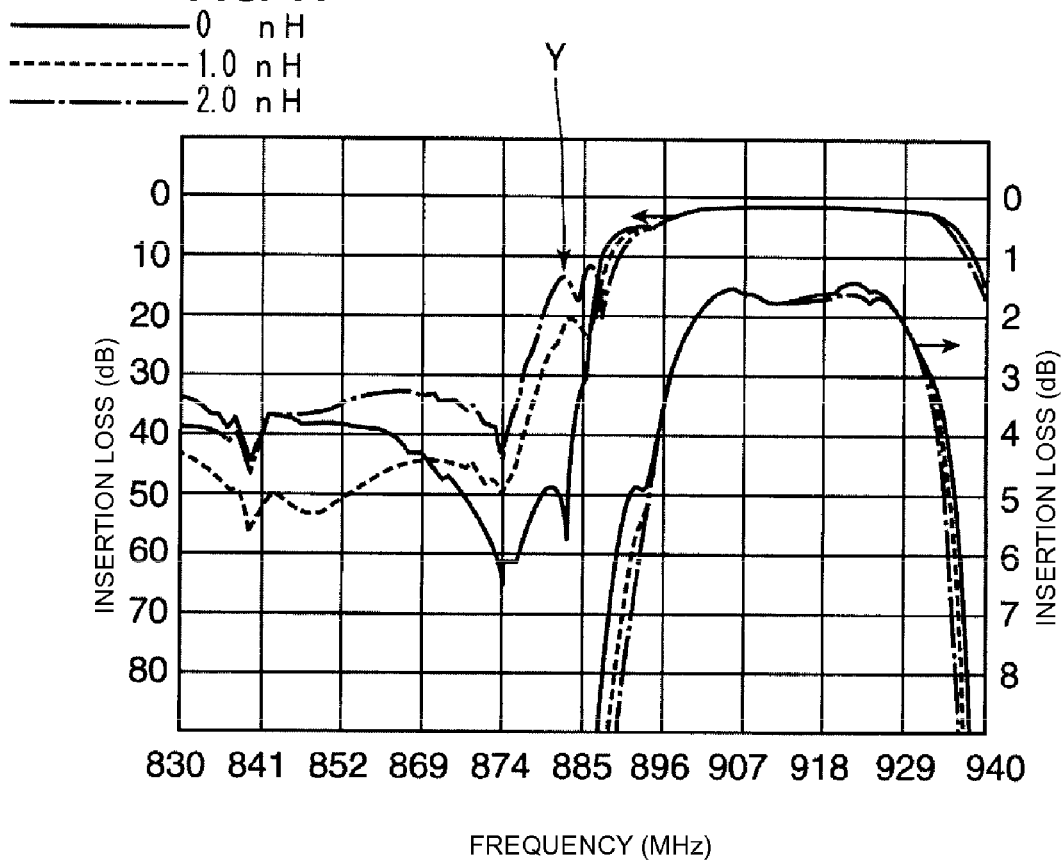
FIG. 11 is a graph showing, regarding filter characteristics of a known branching filter, changes in characteristics of the second band-pass filter in the case that an inductance connected thereto is changed.
Figure 12:
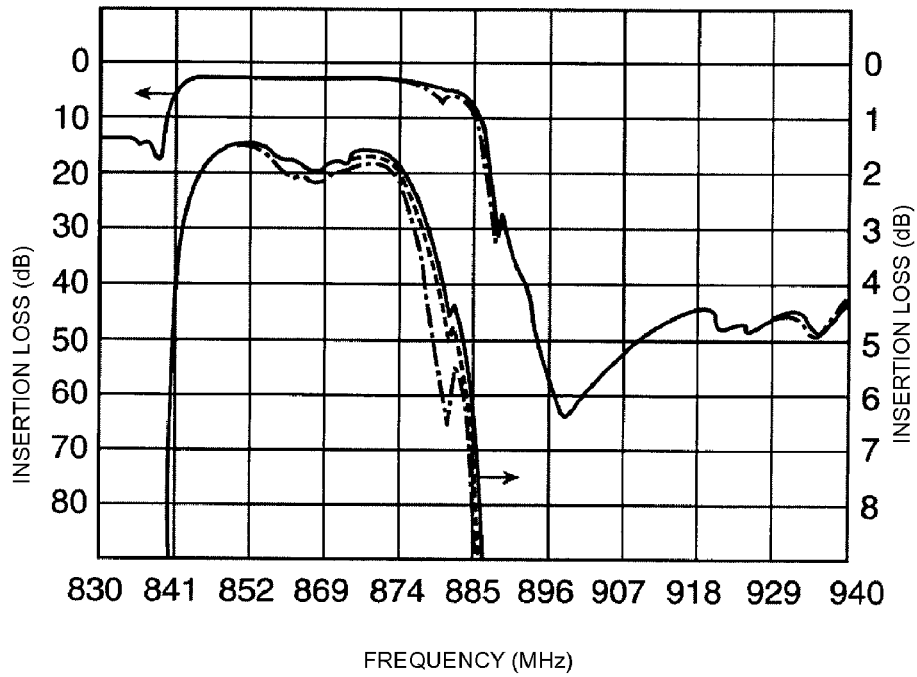
FIG. 12 is a graph showing, regarding the filter characteristics of the known branching filter, changes in characteristics of the first band-pass filter in the case that an inductance connected thereto is changed.
Figure 13:
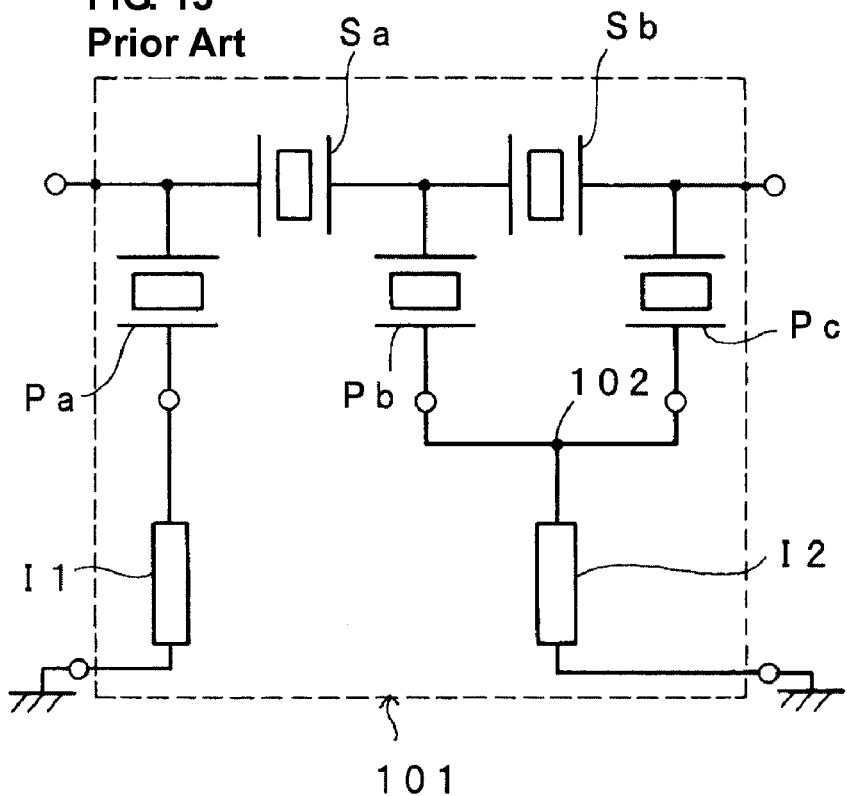
FIG. 13 is a circuit diagram showing the structure of a SAW circuit used in the known branching filter.

FIGS. 11 and 12 are graphs showing problems in the case that the branching filter shown in FIGS. 1A to 1C is structured using SAW filters as in the related art described above. FIG. 11 shows filter characteristics of the second band-pass filter F2 serving as the transmission-side band-pass filter in the case that the value of the inductance L1 is changed from 0 nH to 1.0 nH and 2.0 nH. FIG. 12 shows filter characteristics of the first band-pass filter F1 serving as the reception-side band-pass filter.

As is clear from FIGS. 11 and 12, in the case that the value of the inductance L1 is 1.0 nH, the attenuation at the low frequency side of the passband of the second band-pass filter F2 can be improved in the passband of the first band-pass filter F1 serving as the other band-pass filter. However, an increase in the value of the inductance L1 degrades the steepness of the filter characteristics at the high frequency side of the passband of the first band-pass filter F1 serving as the reception-side band-pass filter, resulting in a narrower pass band width. This is because an undesired ripple indicated by arrow Y appears in the vicinity of 880-885 MHz in FIG. 11. As is clear from FIG. 12, a large ripple also appears at substantially the same frequency position as the ripple Y at the high frequency side of the passband of the other band-pass filter F1. As a result, it can be concluded that the larger the value of the inductance L1, the narrower the passband of the band-pass filter F1.

In the case that the branching filter is structured using the known structure of the band-pass filter F2, the effect of the ripple caused by interference between the band-pass filter F2 and the band-pass filter F1 appears strikingly. As a result, the pass band width of the band-pass filter F1 becomes narrow. The cause of this problem is as follows. That is, reflection characteristics at frequencies corresponding to a ripple generated in the band-pass filter F2 approach 50Ω locally. This increases a signal leakage to the band-pass filter F2, that is, a parallel connection loss, in the passband of the band-pass filter F1. As a result, the passband of the band-pass filter F1 becomes narrower.

In contrast, according to the branching filter 1 of the present preferred embodiment, an impedance $Z_1$ of the first parallel resonator P11 is set to be higher than an impedance $Z_2$ of the second parallel resonator P12. Let f1 be a resonant frequency of the first parallel resonator P11, f2 be a resonant frequency of the second parallel resonator P12, and f0 be an average of resonant frequencies of the first to third parallel resonators P11 to P13, then, a relationship f1>f0>f2 is satisfied. As will be apparent from the following experiment, ripple at the low frequency side of the passband of the second band-pass filter F2 can be suppressed. Therefore, the ripple occurs negligibly at the high frequency side of the passband of the first band-pass filter F1, which has a relatively low passband, and hence, the first band-pass filter F1 has a sufficient pass band width. This will be described on the basis of the specific experiment.

A plurality of electrodes were formed on a piezoelectric substrate formed of a 44.5° Y-cut X-propagation $LiTaO_3$ substrate by a photolithography-lift off process, thereby constructing first and second band-pass filters F1 and F2. In this manner, a branching filter chip 31 was produced, which is shown in a schematic cross section in FIG. 4. In the branching filter chip 31, various electrodes were formed on a piezoelectric substrate 31a, thereby constructing the first and second band-pass filters F1 and F2.

The branching filter chip 31 was housed in a package 32 having an upward aperture 32a, and the aperture 32a was closed with a cover 33. The package 32 was formed of a ceramic multilayer substrate and had electrode pads 34a and 34b connected to the branching filter chip 31. The electrode pads 34a and 34b were electrically connected to the electrodes on the branching filter chip 31 using schematically-shown bonding wire lines 35a and 35b, respectively. In the package 32, wiring electrodes including via-hole electrodes 36a and 36b were provided. Bottom ends of the via-hole electrodes 36a and 36b were connected to terminal electrodes 37a and 37b, respectively. The terminal electrodes 37a and 37b were arranged to electrically connect the branching filter chip 31 to an external circuit portion.

Figure 4:
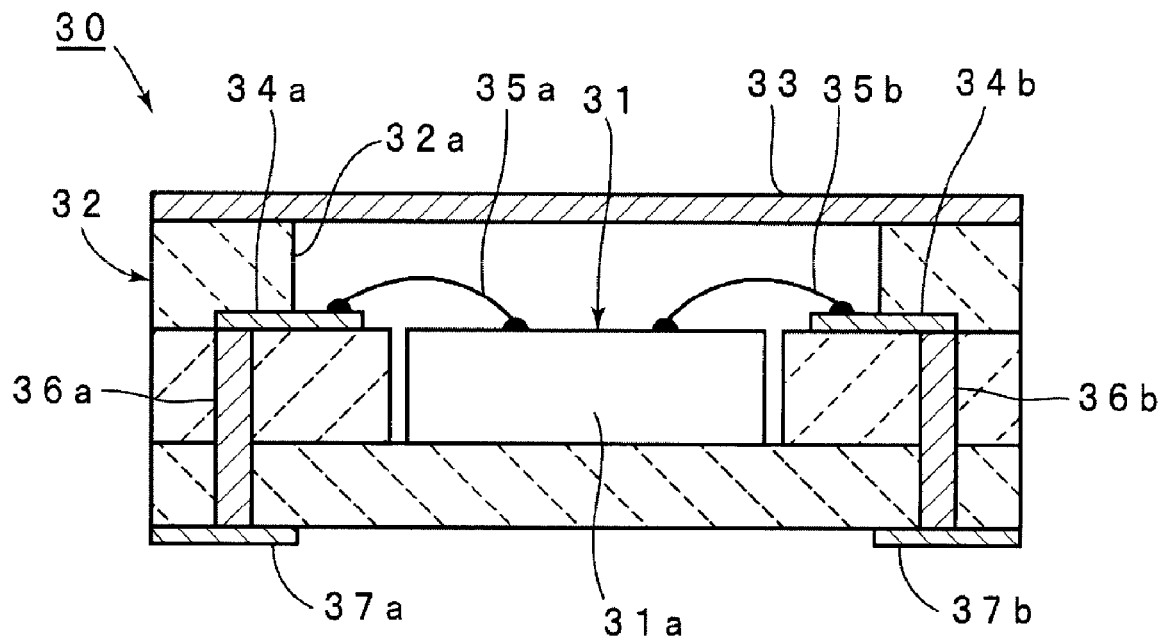
FIG. 4 is a front cross-section schematically showing an example of a specific structure of the branching filter according to the first preferred embodiment of the present invention.

As shown in FIG. 4, in a branching filter device 30, the wiring electrodes including the via-hole electrodes 36a and 36b were provided in the package 32. According to the present preferred embodiment, the inductance value of the above-described first inductance L1 was set using parasitic inductances of the wiring electrodes. Note that the inductance value of the first inductance L1 may be obtained using, instead of the inductances of the wiring electrodes, inductances of the bonding wire lines 35a and 35b. The inductance value of the first inductance L1 may be obtained using all of these inductances. Alternatively, an additional inductance component may be prepared and housed in the package 32, or an inductance element may be contained within interior of the package 32.

Similarly, the second inductance L2 may be obtained using the wiring lines and/or the bonding wire lines. Alternatively, the second inductance L2 may be obtained using an inductance element housed in the package 32 or contained within interior of the package 32.

In the branching filter 1 in the example of the above-described preferred embodiment, regarding each of the series resonators S1 to S4 of the first band-pass filter F1, the wavelength was within approximately 4.492-4.535 μm, the duty was about 0.52, the number of pairs of electrode fingers was within 110-140 pairs, and the electrode-finger overlap width was within about 40-69 μm. Regarding each of the first to third parallel resonators, the wavelength was within approximately 4.697-4.733 μm, the duty was about 0.52, the number of pairs of electrode fingers was within 110-140 pairs, and the electrode-finger overlap width was within about 39-42 μm.

Regarding each of the series resonators S11 to S15 of the second band-pass filter F2, the wavelength was within approximately 4.191-4.260 μm, the duty was about 0.52, the number of pairs of electrode fingers was within 80-140 pairs, and the electrode-finger overlap width was within about 40-53 μm. The first to third parallel resonators P11 to P13 were structured according to Table 1 shown below.

The duty refers to the ratio of a width-direction size of an electrode finger to a pitch between electrode fingers of an IDT.

TABLE 1

| | Wavelength (μm) | Duty | Number of pairs | Overlap width (μm) |
|---|---|---|---|---|
| Parallel resonator P13 of first embodiment | 4.433 | 0.52 | 170 | 48.6 |
| Parallel resonator P12 of first embodiment | 4.433 | 0.62 | 190 | 46.5 |
| Parallel resonator P11 of first embodiment | 4.433 | 0.42 | 120 | 48.4 |
| Parallel resonator P13 of comparative example | 4.433 | 0.52 | 170 | 48.6 |
| Parallel resonator P12 of comparative example | 4.433 | 0.52 | 190 | 46.5 |
| Parallel resonator P11 of comparative example | 4.433 | 0.52 | 120 | 48.4 |

The impedance of a parallel resonator is inversely proportional to the product of the number of pairs of electrode fingers×overlap width. Thus, in Table 1, according to the first preferred embodiment, the impedance $Z_1$ of the parallel resonator P11 is larger than the impedance $Z_2$ of the second parallel resonator. According to the first preferred embodiment, the resonant frequency f1 of the first parallel resonator P11 is set to be higher than the resonant frequency f2 of the second parallel resonator P12.

In the present preferred embodiment, let f3 be a resonant frequency of the third parallel resonator P13, and it is preferable that f3 be different from f1 or f2. Also, f3 may be higher than f1 and lower than f2.

Figure 2:
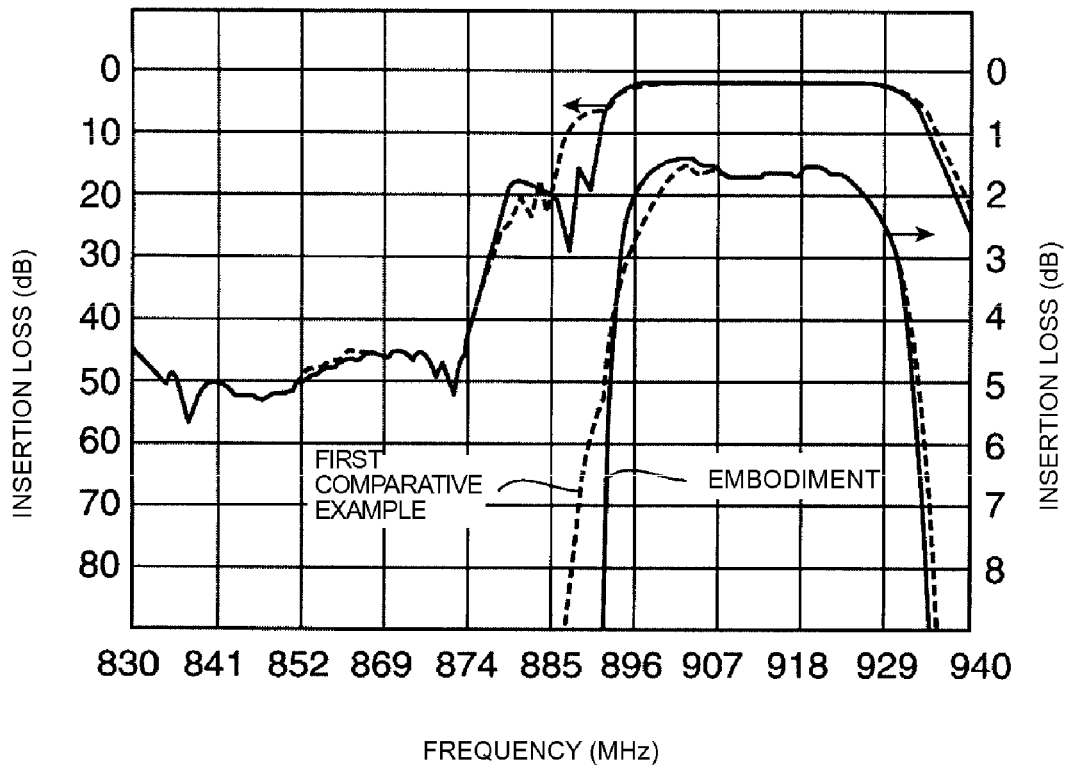
FIG. 2 is a graph showing filter characteristics of the second band-pass filter serving as a transmission-side band-pass filter of the branching filter according to the first preferred embodiment of the present invention and a first comparative example.
Figure 3:
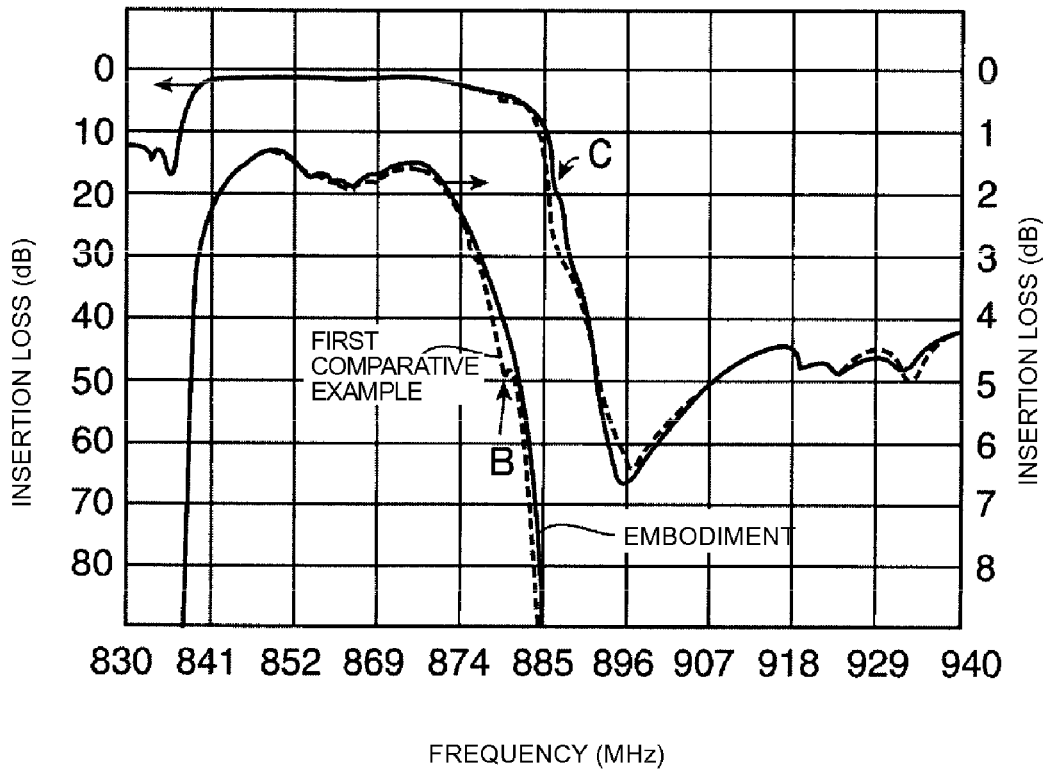
FIG. 3 is a graph showing filter characteristics of the first band-pass filter serving as a reception-side band-pass filter of the branching filter according to the first preferred embodiment of the present invention and the first comparative example.

In FIG. 2, a solid line shows attenuation frequency characteristics of the second band-pass filter F2 in the branching filter 1 of the present preferred embodiment. In FIG. 3, a solid line shows attenuation frequency characteristics of the first band-pass filter F1.

At the same time, a branching filter of a first comparative example was produced in the same manner as the above-described preferred embodiment except that the specifications of the parallel resonators P11 to P13 of the second band-pass filter F2 were different. In the branching filter of the first comparative example, the wavelength, the duty, the number of pairs of electrode fingers, and the overlap width of each of the parallel resonators P11 to P13 are as shown in Table 1 above. That is, the three parallel resonators have the equal wavelength, duty, and resonant frequency. In FIG. 2, a broken line shows attenuation frequency characteristics of the second band-pass filter serving as the transmission-side band-pass filter in the branching filter of the first comparative example. In FIG. 3, a broken line shows attenuation frequency characteristics of the first band-pass filter F1 of the first comparative example.

As is clear from FIG. 2, compared with the case of the second band-pass filter F2 having a relatively high passband, the pass band width can be widened according to the present preferred embodiment. More specifically, whereas the pass band width of the second band-pass filter F2 with an insertion loss of 2 dB was 27 MHz in the first comparative example, the pass band width according to the present preferred embodiment was 30 MHz, which has been widened. As shown in FIG. 3, whereas undesired ripple indicated by arrow B appeared at the high frequency side of the passband of the first band-pass filter in the first comparative example, the occurrence of such ripple can be suppressed according to the present preferred embodiment.

That is, according to the present preferred embodiment, the ripple has been shifted to the position indicated by arrow C in FIG. 3, that is, toward the high frequency side. Therefore, according to the present preferred embodiment, as shown in FIG. 3, filter characteristics at the high frequency side of the passband of the first band-pass filter F1 serving as the reception-side band-pass filter can be improved, thereby achieving a sufficient pass band width.

In other words, since the ripple generated at the high frequency side of the passband of the first band-pass filter F1 serving as the reception-side band-pass filter is shifted to the high frequency side, the steepness of the filter characteristics is improved, and the bandwidth is increased. It is also clear that the attenuation in the passband of the first band-pass filter of the filter characteristics of the second band-pass filter F2 changes negligibly even in the case that the parallel resonators P11 to P13 have different resonant frequencies. That is, the filter characteristics can be improved without limiting the advantage in that the attenuation in the passband of the first band-pass filter F1 is improved by constructing the second band-pass filter F2 as a polar filter.

In the second band-pass filter F2 serving as the transmission-side band-pass filter, the ripple is shifted to the high frequency side, and shoulder characteristics at the low frequency side of the passband are improved. Therefore, the pass band width with a small insertion loss becomes wider, and the pass band width with a large insertion loss becomes narrower. Thus, the filter characteristics are effectively improved.

As has been described above, in the second band-pass filter F2 with a relatively high passband, even in the case that the first inductance L1 is connected to the common-connection terminal 23, since the resonant frequencies f1 and f2 of the parallel resonators P11 and P12 are different, undesired ripple occurring at the low frequency side of the passband can be shifted to the high frequency side while maintaining the attenuation characteristics at the low frequency side of the passband. Thus, a ripple generated in a high frequency region within the passband of the first band-pass filter F1 having a relatively low passband is shifted to outside the passband. Therefore, the bandwidth and the steepness of the filter characteristics can be effectively increased.

As will be described later, since the resonant frequency f1 of the parallel resonator P11 having the highest impedance is set to be higher than the average f0 of the resonant frequencies of the parallel resonators P11 to P13, and the resonant frequency f2 of the parallel resonator P12 having the lowest impedance is set to be lower than the average f0, the bandwidth of the second band-pass filter F2 can also be improved.

Second Preferred Embodiment

A branching filter of a second preferred embodiment has a circuit structure similar to that of the branching filter 1 of the first preferred embodiment. Therefore, the description of the circuit structure shown in FIGS. 1A to 1C is applied to the branching filter of the second preferred embodiment. In the second preferred embodiment, as will be shown in Table 2 below, the parallel resonators P12 and P13 of the second band-pass filter F2 have the equal duty, though they have different wavelengths. Other than these points, the branching filter of the second preferred embodiment has the same structure as the branching filter 1 of the first comparative example, which has been given as a comparative example to the first preferred embodiment described above.

Figure 5:
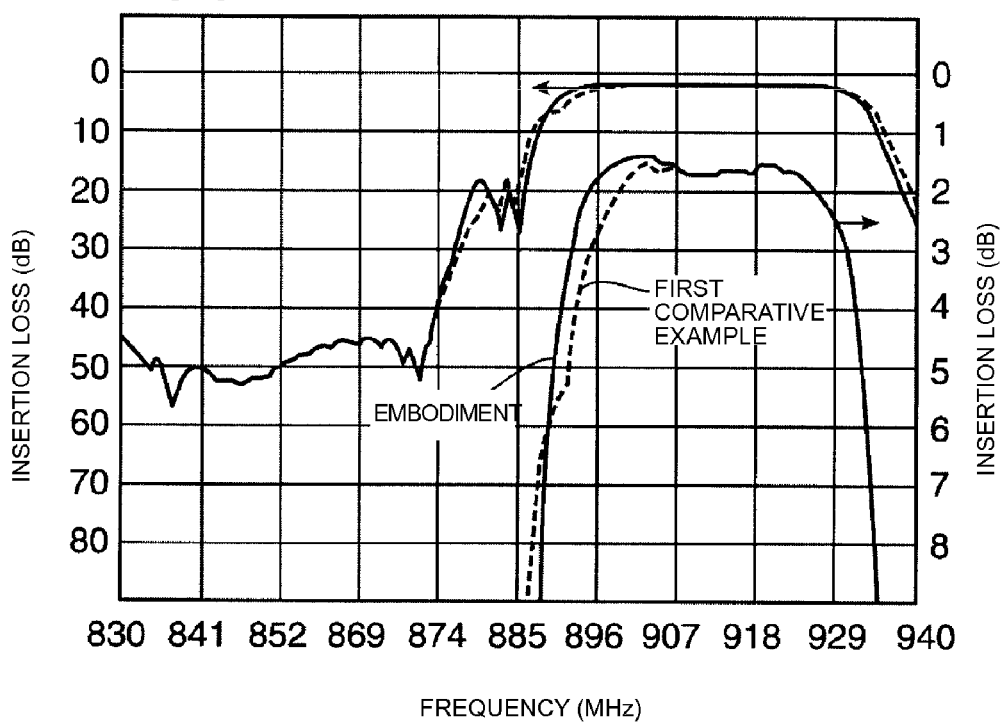
FIG. 5 is a graph showing filter characteristics of the second band-pass filter serving as the transmission-side band-pass filter of the branching filter according to a second preferred embodiment of the present invention and the first comparative example.

Filter characteristics of the above-structured branching filter of the second preferred embodiment and filter characteristics of the branching filter of the first comparative example described above are shown in FIGS. 5 and 6. FIG. 5 shows the filter characteristic of the second band-pass filter F2 serving as the transmission-side band-pass filter, where a solid line shows the filter characteristics of the second preferred embodiment, and a broken line shows the filter characteristics of the first comparative example. FIG. 6 shows the filter characteristics of the first band-pass filter F1 serving as the reception-side band-pass filter, where a solid line shows the result of the second preferred embodiment, and a broken line shows the result of the first comparative example.

TABLE 2

|  | Wavelength (μm) | Duty | Number of pairs | Overlap width (μm) |
| --- | --- | --- | --- | --- |
| Parallel resonator P13 of second embodiment | 4.433 | 0.52 | 170 | 48.6 |
| Parallel resonator P12 of second embodiment | 4.451 | 0.52 | 190 | 46.5 |
| Parallel resonator P11 of second embodiment | 4.411 | 0.52 | 120 | 48.4 |

As is clear from FIGS. 5 and 6, a ripple appearing at the high frequency side of the passband of the first band-pass filter F1 serving as the reception-side band-pass filter is also shifted to the high frequency side in the second preferred embodiment. However, the improvement of the filter characteristics in the second preferred embodiment achieved by shifting the ripple to the high frequency side is somewhat smaller than that of the first preferred embodiment. Nevertheless, the ripple is effectively suppressed, compared with the first comparative example. The result shows that the undesired ripple is suppressed, and the filter characteristics are thus improved by not only having different duties, but also by having different wavelengths of the first and second parallel resonators P11 and P12.

As is clear from the results of the first and second preferred embodiments, the effect of ripple at the high frequency side of the passband of the first band-pass filter F1 can be suppressed by changing parameters, such as the wavelength and the duty, of the first and second parallel resonators P11 and P12 of the transmission-side band-pass filter F2. The larger the wavelength and the duty, the smaller the resonant frequency of the parallel resonator.

However, the improvement may not be achieved by simply having different resonant frequencies f1 and f2 of the parallel resonators P11 and P12. That is, of the parallel resonators P11 and P12, the resonant frequency f1 of the parallel resonator having the highest impedance needs to be higher than the average f0 of the resonant frequencies of the first to third parallel resonators P11 to P13, and the resonant frequency f2 of the parallel resonator P12 having the lowest impedance needs to be lower than the average f0. The reason for this condition will be described below.

Figure 8:
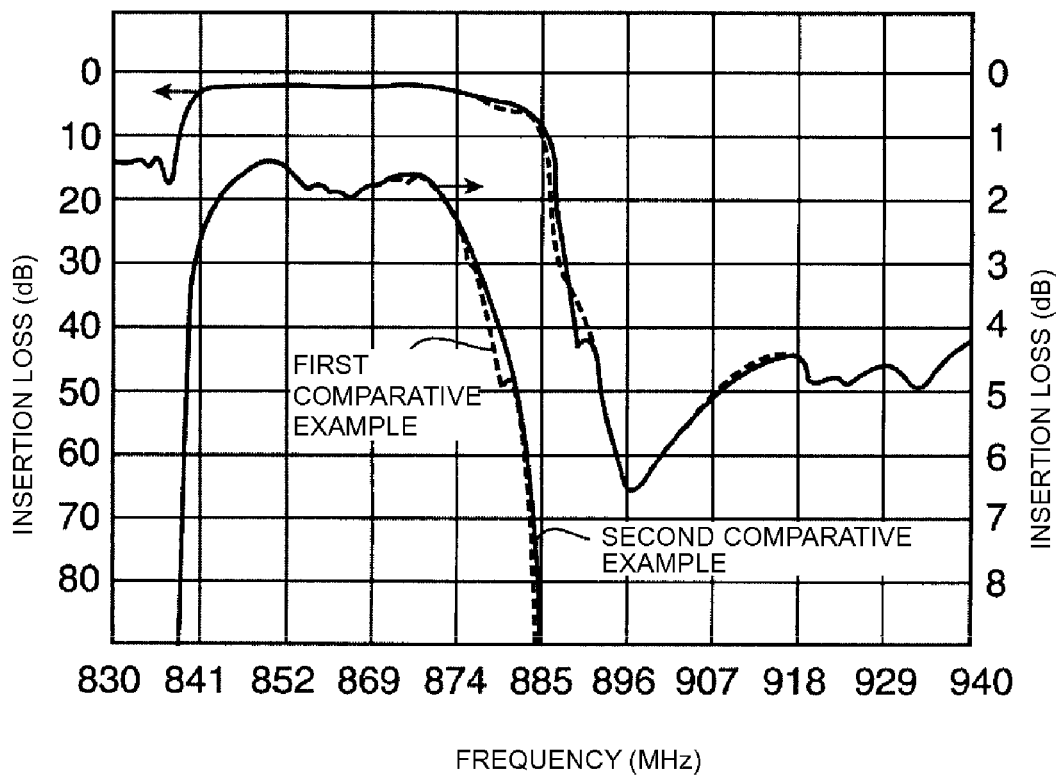
FIG. 8 is a graph showing filter characteristics of the first band-pass filter serving as the reception-side band-pass filter of the branching filter according to the second comparative example and the first comparative example of preferred embodiments of the present invention.

As shown in Table 3 below, a branching filter of a second comparative example was produced in the same manner as the first comparative example except that the wavelengths of the first and second parallel resonators P11 and P12 were shorter than those of the first comparative example. FIGS. 7 and 8 show the filter characteristics of the above-structured second comparative example in comparison to the filter characteristics of the first comparative example. FIG. 7 shows the filter characteristics of the second band-pass filter serving as the transmission-side band-pass filter, where a solid line shows the result of the second comparative example, and a broken line shows the result of the first comparative example.

FIG. 8 shows the filter characteristics of the first band-pass filter serving as the reception-side band-pass filter, where a solid line shows the result of the second comparative example, and a broken line shows the result of the first comparative example.

As is clear from FIGS. 7 and 8, in the branching filter of the second comparative example, a ripple at the high frequency side of the passband of the first band-pass filter F1 can be suppressed, but the pass band width of the second band-pass filter at the transmission side is narrower overall.

The pass band width of a ladder filter is determined by the difference between an average f0 of resonant frequencies of parallel resonators connected to all parallel arms and an average fx of anti-resonant frequencies of series resonators, $\Delta f=fx-f0$. In the branching filter of the second comparative example, the higher the average f0 of the resonant frequencies of the parallel resonators, the smaller the $\Delta f$. Thus, the pass band width of the second band-pass filter F2 becomes narrower. The position of the attenuation pole of the second band-pass filter F2 in the passband of the first band-pass filter F1 serving as the other filter is also changed, which may result in lack of attenuation depending on the expected characteristics.

As a third comparative example, as shown in Table 3 below, a branching filter of the third comparative example was produced in the same manner as the first preferred embodiment except that the duties of the first and second parallel resonators P11 and P12 were opposite to those of the first preferred embodiment. That is, in the branching filter of the third comparative example, the duty of the first parallel resonator P11 was 0.62, and the duty of the second parallel resonator P12 was 0.42.

Figure 9:
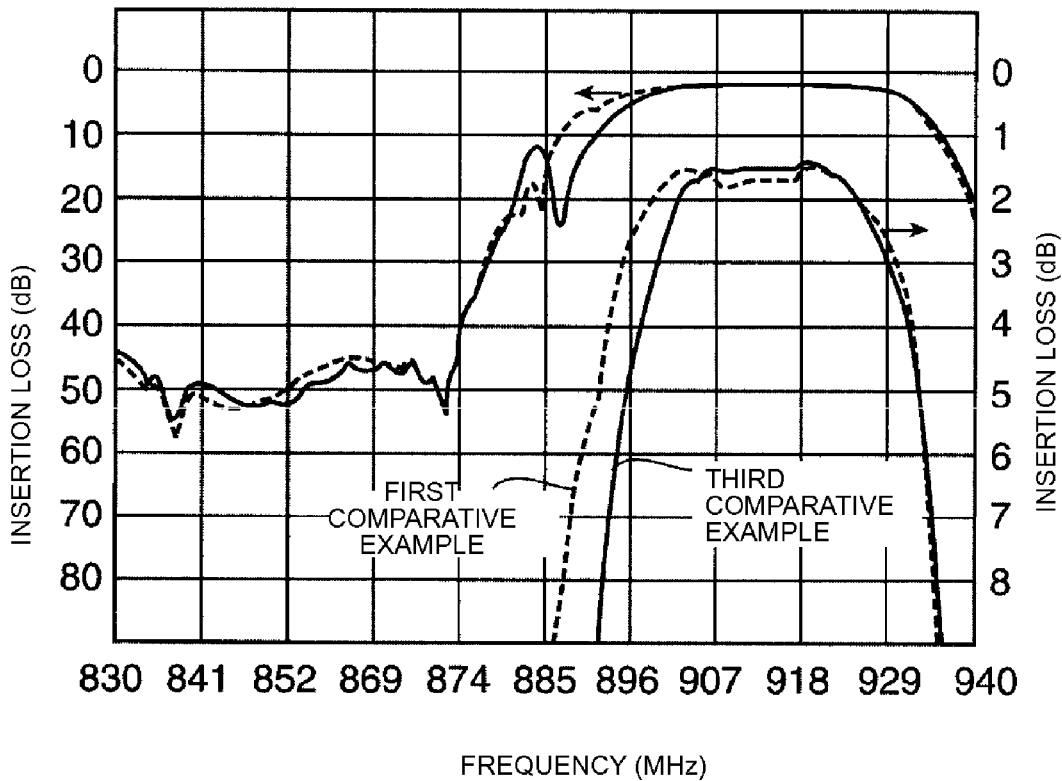
FIG. 9 is a graph showing filter characteristics of the second band-pass filter serving as the transmission-side band-pass filter of the branching filter according to a third comparative example and the first comparative example of preferred embodiments of the present invention.
Figure 10:
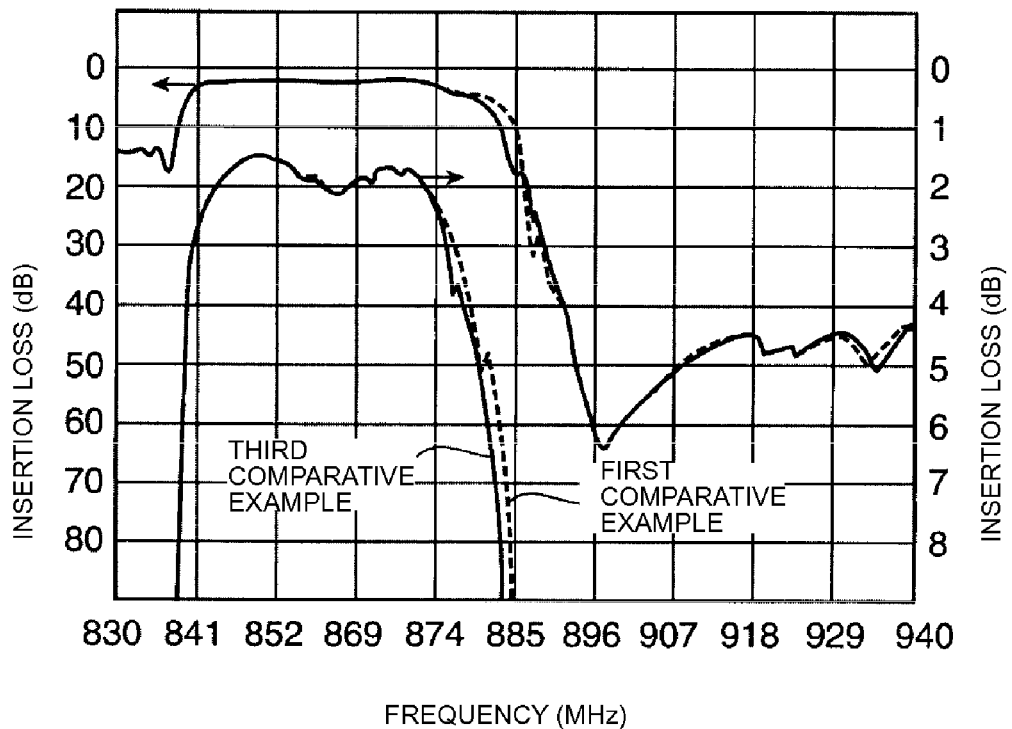
FIG. 10 is a graph showing filter characteristics of the first band-pass filter serving as the reception-side band-pass filter according to the third comparative example and the first comparative example of preferred embodiments of the present invention.

FIGS. 9 and 10 show a comparison between the filter characteristics of the above-structured branching filter of the third comparative example and the filter characteristics of the branching filter of the first comparative example describe above. FIG. 9 shows the filter characteristics of the second band-pass filter serving as the transmission-side band-pass filter, where a solid line shows the result of the third comparative example, and a broken line shows the result of the first comparative example. FIG. 10 shows the filter characteristics of the first band-pass filter F1 serving as the reception-side band-pass filter, where a solid line shows the result of the third comparative example, and a broken line shows the result of the first comparative example.

As is clear from FIGS. 9 and 10, in the branching filter of the third comparative example, large ripple appears at the high frequency side of the first band-pass filter F1, resulting in worse filter characteristics. As shown in FIG. 9, in the third comparative example, the pass band width of the second band-pass filter serving as the transmission-side band-pass filter is narrower overall.

In the third comparative example, the resonant frequency f1 of the first parallel resonator P11 having a relatively high impedance is low, and the resonant frequency f2 of the second parallel resonator P12 having a relatively low impedance is high. Thus, the effect of the ripple generated by the parallel resonator P12 has appeared significantly near the passband of the second band-pass filter F2. The impedance is inversely proportional to the product of the number of pairs of electrode fingers x overlap width. The lower the impedance, the more striking the effect of the ripple appears. Therefore, in the case of a parallel resonator having low impedance, the resonant frequency is preferably placed as far as possible from the passband. In the case of a parallel resonator having high impedance, the resonant frequency is preferably placed as close as possible to the passband. Accordingly, deterioration of the pass band width of the transmission-side band-pass filter can be suppressed.

The second band-pass filter F2 is a polar filter. That is, the common-connection GND terminal 23 is connected to the ground potential with the first inductance L1 interposed therebetween. In the above-described preferred embodiments, two parallel arms are commonly connected. However, three or more parallel arms may be commonly connected.

Figure 14:
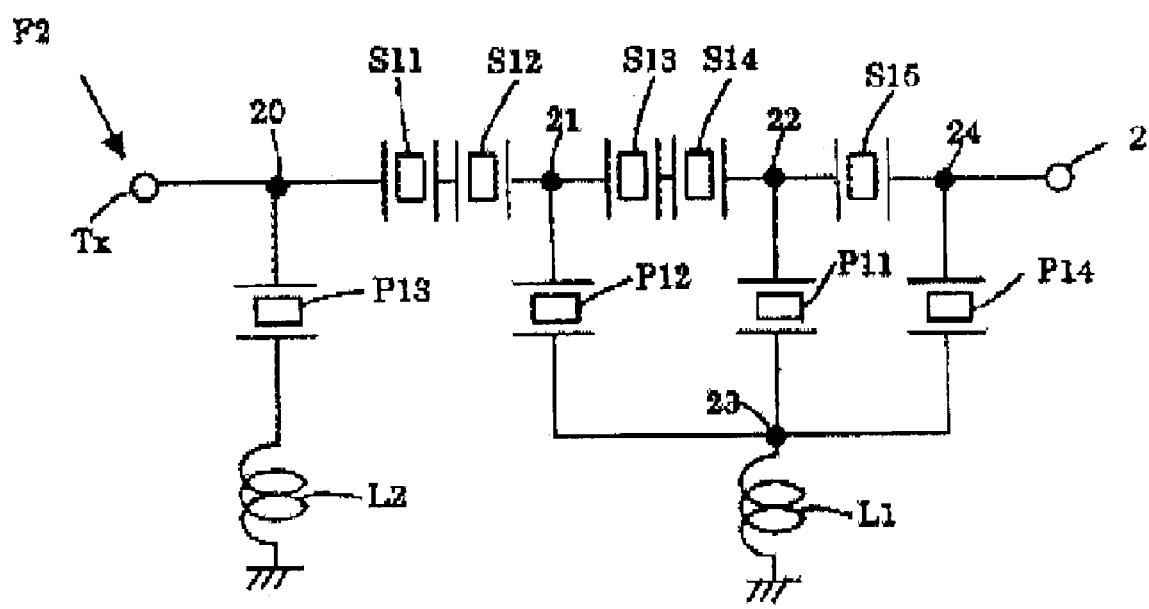
FIG. 14 is a circuit diagram of a modified second band-pass filter F2 of the branching filter shown in FIG. 1(a).

That is, besides the first and second parallel resonators P11 and P12, as shown in FIG. 14, at least one fourth parallel resonator P14 may be connected to one or more parallel arms different from the first and second arms to which the first and second parallel resonators are located. In that case, the frequency positions of a plurality of attenuation poles corresponding to the resonant frequency of a circuit including, in addition to the first and second parallel resonators, at least one fourth parallel resonator and the inductance L1 may be adjusted, and a plurality of ripples may be dispersed in a similar manner.

It is preferable that, as in the above-described preferred embodiments, the number of commonly-connected parallel arms be two. Compared with the case in which three or more parallel arms are connected to a common-connection GND terminal, with the structure in which two parallel arms are connected to the common-connection GND terminal 23 as in the above-described preferred embodiments, the above-described ripple can be effectively suppressed, which is desirable.

It is also preferable that multiple parallel resonators interposed between parallel arms that are commonly connected to a common-connection GND terminal have different resonant frequencies. That is, the positions of ripples due to the parallel resonators connected to the common-connection GND terminal can be dispersed by making the resonant frequencies of the parallel resonators interposed between the parallel arms different, and hence, the effect of the ripples can be reduced. More preferably, the resonant frequency of the third parallel resonator P13, which is not connected to the common-connection GND terminal, is different from the resonant frequencies of the parallel resonators P11 and P12 connected to the common-connection GND terminal 23. Accordingly, the positions of the ripples can be dispersed more effectively.

TABLE 3

|  | Wavelength (μm) | Duty | Number of pairs | Overlap width (μm) |
|---|---|---|---|---|
| Parallel resonator P13 of second comparative example | 4.433 | 0.52 | 170 | 48.6 |
| Parallel resonator P12 of second comparative example | 4.418 | 0.52 | 190 | 46.5 |
| Parallel resonator P11 of second comparative example | 4.418 | 0.52 | 120 | 48.4 |
| Parallel resonator P13 of third comparative example | 4.433 | 0.52 | 170 | 48.6 |
| Parallel resonator P12 of third comparative example | 4.433 | 0.42 | 190 | 46.5 |
| Parallel resonator P11 of third comparative example | 4.433 | 0.62 | 120 | 48.4 |

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A branching filter comprising:
   a first band-pass filter having a relatively low frequency passband; and
   a second band-pass filter having a relatively high frequency passband; wherein
   the first and second band-pass filters each include a surface acoustic wave filter having a ladder circuit structure including series resonators and parallel resonators, and ends of the first and second band-pass filters are connected to one common terminal;
   the second band-pass filter is a polar filter including:
   a first parallel resonator having a relatively high impedance $Z_1$ and a relatively high resonant frequency $f1$;
   a second parallel resonator having a relatively low impedance $Z_2$ and a relatively low resonant frequency $f2$, the second parallel resonator being connected to a parallel arm that is different from that to which the first parallel resonator is connected, a common-connection ground terminal commonly connected to ends of the first parallel resonator and the second parallel resonator, the ends being connected to a ground potential;
   a first inductance connected between the common-connection ground terminal and the ground potential;
   a third parallel resonator connected to a parallel arm that is different from those to which the first and second parallel resonators are connected; and
   a second inductance connected between the third parallel resonator and the ground potential;
   a relationship $f1>f0>f2$ is satisfied, where $f0$ denotes an average of resonant frequencies of all the parallel resonators; and
   the first inductance and the second inductance are arranged to suppress an occurrence of a ripple at a high frequency side of the passband of the first band-pass filter, thereby achieving a sufficient pass band width.

2. The branching filter according to claim 1, further comprising at least one fourth parallel resonator connected to a parallel arm that is different from those to which the first and second parallel resonators are connected, wherein the fourth parallel resonator has an end connected to the ground potential and to the common-connection ground terminal.

3. The branching filter according to claim 1, wherein parallel arms connected to the common-connection ground terminal include only the parallel arm on which the first parallel resonator is located and the parallel arm on which the second parallel resonator is located.

4. The branching filter according to claim 1, wherein the resonant frequency of the third parallel resonator is different from the resonant frequencies of the first and second parallel resonators.

5. The branching filter according to claim 1, wherein the first parallel resonator and the second parallel resonator each have an electrode structure including an IDT, and a duty of electrode fingers of the IDT of the first parallel resonator is different from a duty of electrode fingers of the IDT of the second parallel resonator so that the resonant frequency of the parallel resonator is different from the resonant frequency of the second parallel resonator.

6. The branching filter according to claim 1, wherein an attenuation pole at a high frequency side of a passband of the first band-pass filter is set to a frequency higher than that of an attenuation pole at a low frequency side of a passband of the second band-pass filter.

* * * * *